United States Patent
Lin et al.

(10) Patent No.: US 7,982,642 B1
(45) Date of Patent: Jul. 19, 2011

(54) METHOD FOR TESTING NONLINEARITY ERROR OF HIGH SPEED DIGITAL-TO-ANALOG CONVERTER

(75) Inventors: Chun-Wei Lin, Yunlin County (TW); Sheng-Feng Lin, Yunlin County (TW)

(73) Assignee: National Yunlin University of Science and Technology, Douliu, Yunlin County (TW)

( * ) Notice: Subject to any disclaimer, the term of this patent is extended or adjusted under 35 U.S.C. 154(b) by 0 days.

(21) Appl. No.: 12/684,364

(22) Filed: Jan. 8, 2010

(51) Int. Cl.
*H03M 1/10* (2006.01)
(52) U.S. Cl. .................... 341/120; 341/118
(58) Field of Classification Search ............. 341/118, 341/120
See application file for complete search history.

(56) References Cited

U.S. PATENT DOCUMENTS 6,651,023 B2 * 11/2003 Mori et al. ............... 702/117
2005/0088164 A1 * 4/2005 Geiger et al. ............ 324/76.12

FOREIGN PATENT DOCUMENTS

SU 731584 A * 5/1980

* cited by examiner

*Primary Examiner* — Howard Williams
(74) *Attorney, Agent, or Firm* — Muncy, Geissler, Olds & Lowe, PLLC

(57) ABSTRACT

A novel method applies the down-conversion sampling technology to test a high-speed digital-to-analog conversion. In the method, a digital-to-analog conversion output signal of a high-speed digital-to-analog converter and a low-frequency sinusoidal carrier wave signal input to a comparator to obtain a low-speed pulse signal. Therefore, the variation of the pulse width of the low-speed pulse signal can be measured by a common logic analyzer to assess the nonlinearity error of the high-speed digital-to-analog converter.

6 Claims, 13 Drawing Sheets

METHOD FOR TESTING NONLINEARITY ERROR OF HIGH SPEED DIGITAL-TO-ANALOG CONVERTER

FIELD OF THE INVENTION

The present invention relates to a method for testing a digital-to analog converter, particularly to a method for testing the nonlinearity error of a high-speed digital-to-analog converter.

BACKGROUND OF THE INVENTION

The high-speed digital-to-analog (D/A) converter has been extensively applied to consumer electronics and communication technology. Refer to FIG. 1. In the conventional test method for the D/A converter (DAC) 1, a precision analog signal measurement circuit 3 containing a sample-hold circuit 4 is arranged in the output 2 of the D/A converter 1. The performance, especially the accuracy and stability, of the sample-hold circuit 4 directly influences the correctness of the measurement results. However, the design for a high-speed or high-resolution hold-sample circuit is hard to realize.

The tested signals are usually converted into special test eigenvalues to facilitate analysis. The test eigenvalues are converted into the frequency or the duty ratio of pulse signals, whereby the digital counting signals can be used to measure analog signals. However, the abovementioned technology needs a high-speed circuit to match the high-speed DAC, which greatly increases the difficulty of design.

SUMMARY OF THE INVENTION

The primary objective of the present invention is to develop a novel DAC test architecture according to the down-conversion sampling technology, whereby the analog signals of a digital-to-analog converter (DAC) is converted into a series of low-speed pulse stream, and whereby the nonlinearity error of DAC is worked out from the width of the pulse signals.

To achieve the abovementioned objective, the method of the present invention comprises steps: obtaining a digital-to-analog conversion output signal from a high-speed DAC; providing a low-frequency carrier wave signal; providing a comparator, and inputting the digital-to-analog conversion output signal and the low-frequency carrier wave signal into the comparator to obtain a low-speed pulse signal; using a logic analyzer to measure the variation of the pulse width of the low-speed pulse signal; working out the nonlinearity error of the high-speed DAC from the variation of the pulse width.

Thus, the present invention does not adopt a high-speed circuit but uses a common logic analyzer to assess the nonlinearity error of a high-speed DAC. Therefore, the present invention can promote the capability of ATE (Automatic Test Equipment) in testing a high-speed DAC.

DETAILED DESCRIPTION OF THE PREFERRED EMBODIMENTS

The embodiments are described in detail in cooperation with the drawings to demonstrate the technical contents of the present invention.

Figure 1:
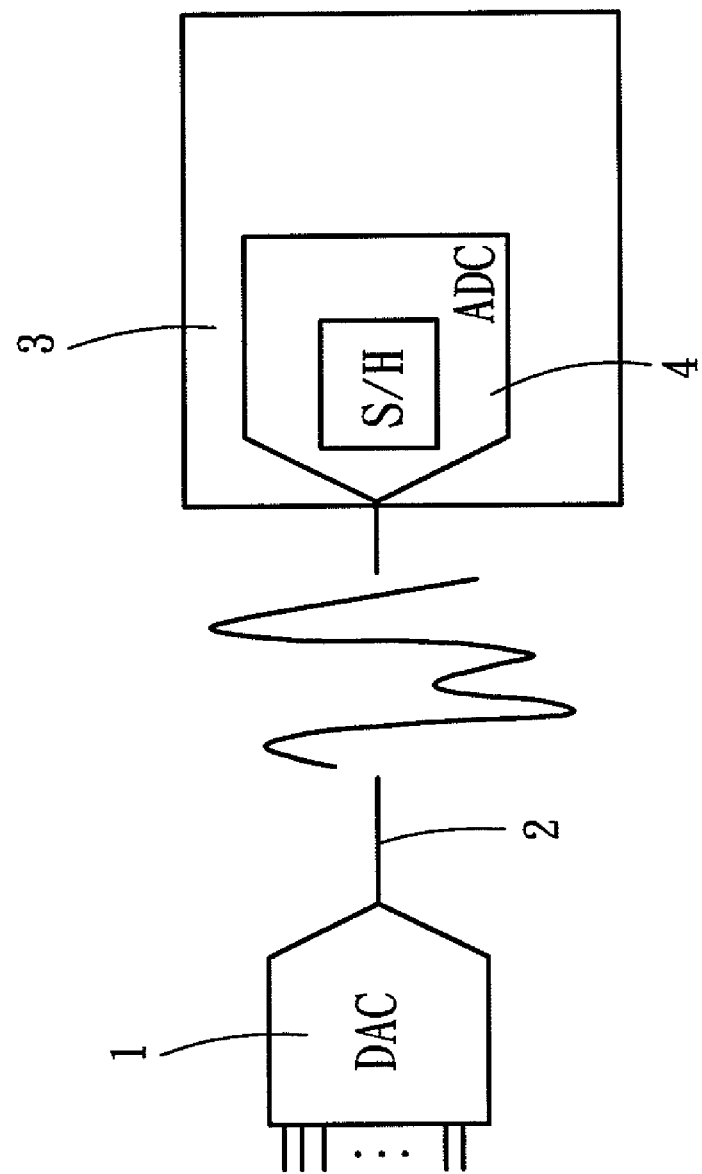
FIG. 1 is a diagram schematically showing the environment where a conventional DAC undertakes a test.
Figure 2:
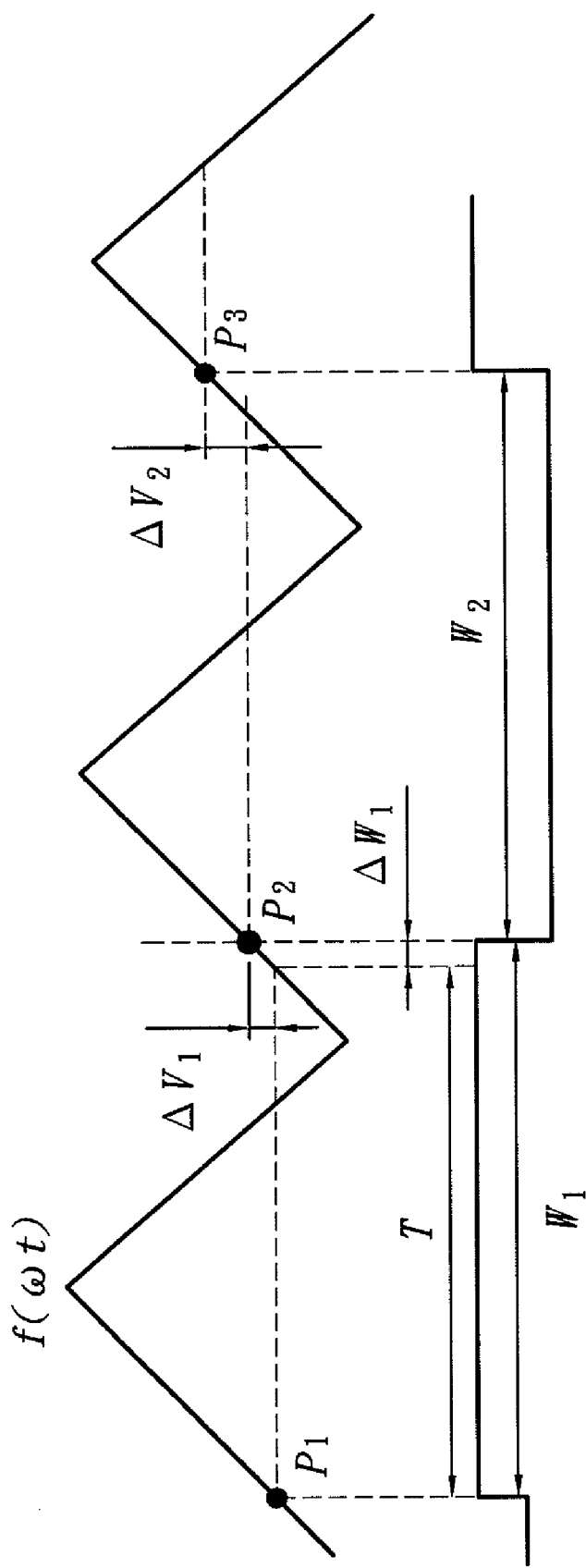
FIG. 2 is a diagram schematically showing the principle of the down-conversion technology adopted by the present invention.
Figure 3:
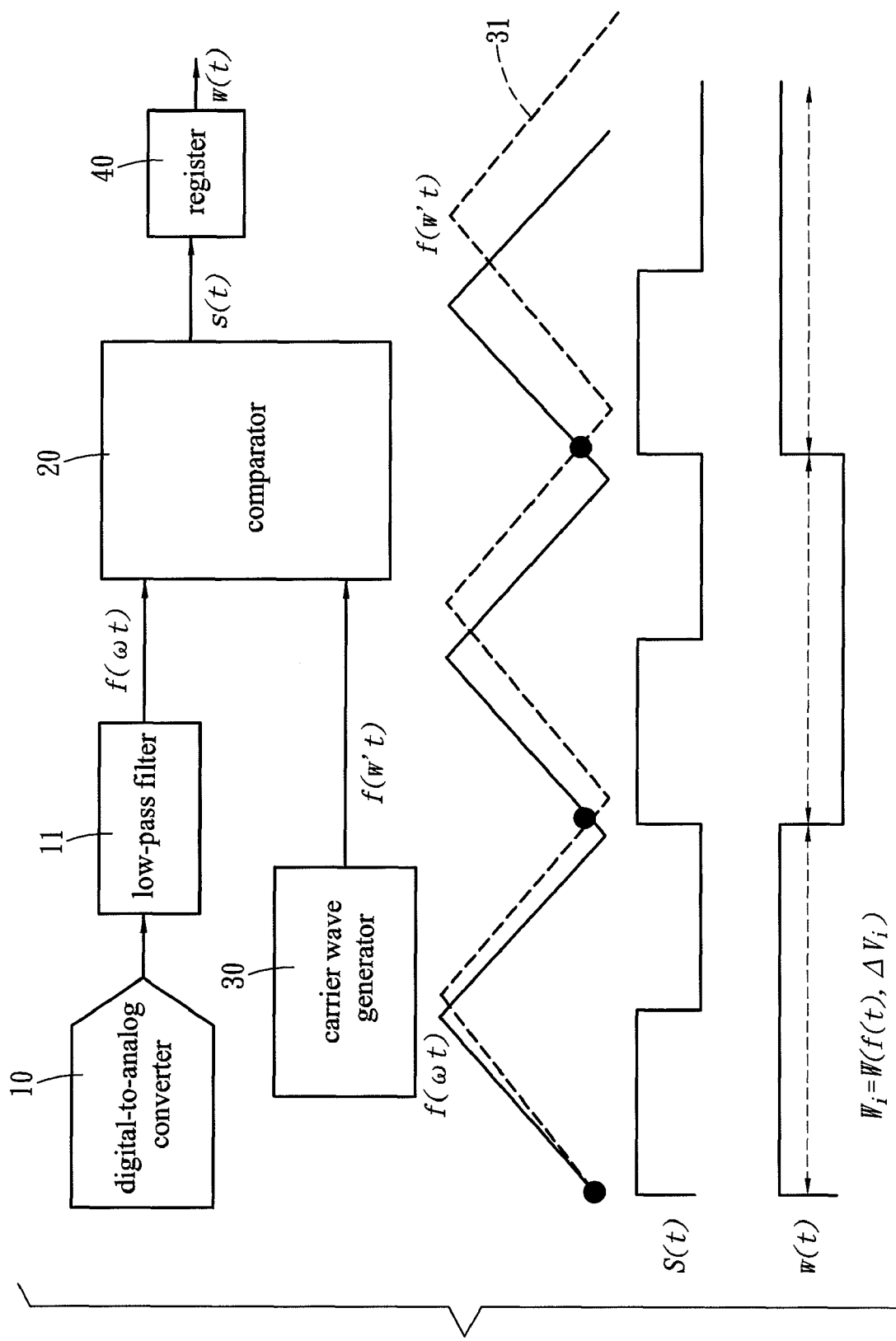
FIG. 3 is a diagram schematically showing the architecture and signal according to the down-conversion technology adopted by the present invention.
Figure 4A:
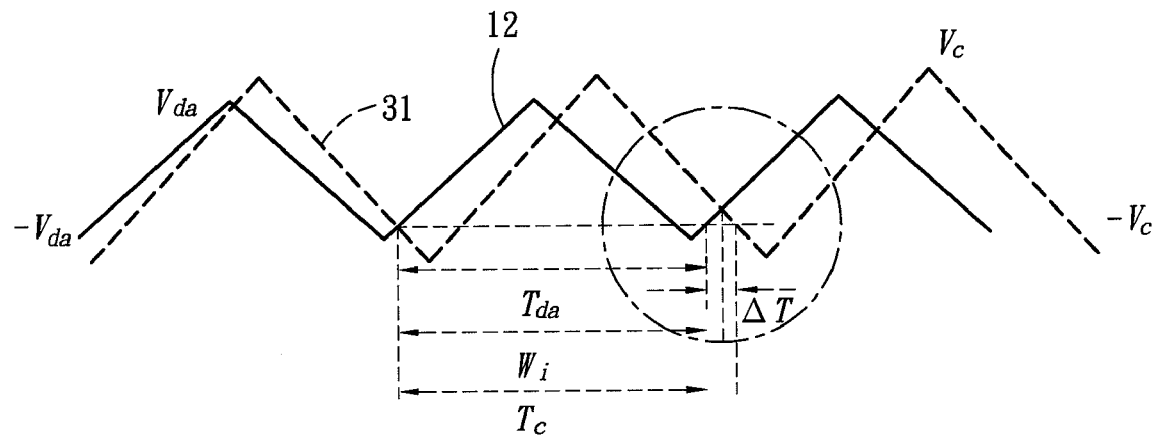
FIG. 4A is a diagram schematically showing a triangular wave used as a low-frequency carrier wave signal according to the present invention.
Figure 4B:
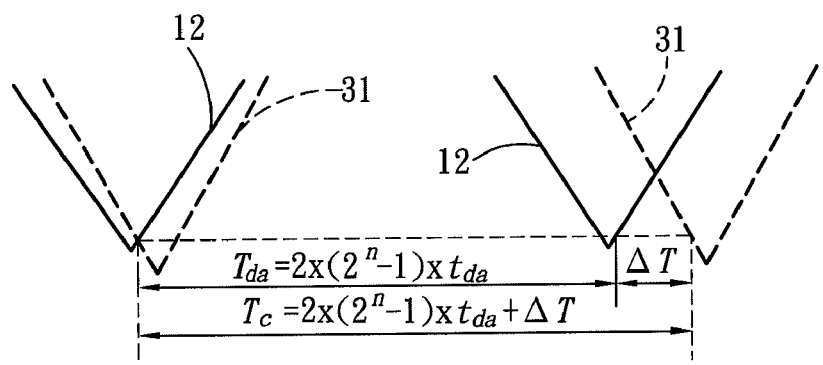
FIG. 4B is a diagram schematically showing the crossover of a tested signal and a triangular carrier wave signal according to the present invention.
Figure 4C:
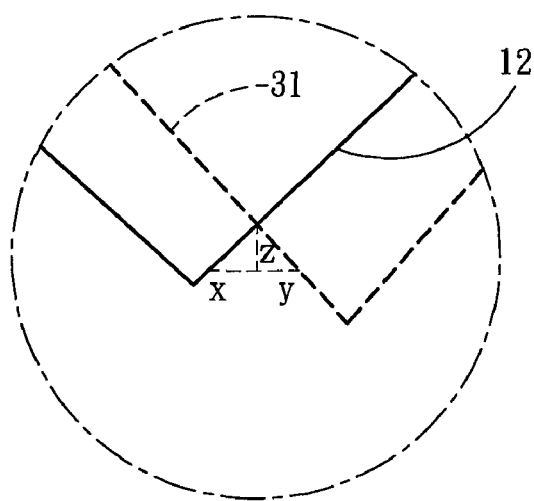
FIG. 4C is a partially enlarged view of FIG. 4A.

Refer to FIG. 2 and FIG. 3 for the sampling theorem of the present invention. Suppose that $f(\omega t)$ is the waveform output by a digital-to-analog converter (DAC) 10 and that the waveform has a period of T. Three sampling points $p_1$, $p_2$ and $p_3$, which are originally sampled from a single cycle, are respectively arranged in three different cycles. Respectively define the time difference and voltage difference of a first sampling point and a second sampling point to be $\Delta W_i$ and $\Delta V_i$. Thus, $\Delta W_i = W_i - T$. The nonlinearity error of the tested circuit $f(\omega t)/dt$ can express the signal difference of the sampling points as the pulse width signal, i.e. the variation of the pulse width $\Delta W_i$.

Refer to FIG. 3 for the sampling circuit according to the present invention. In FIG. 3, $f(\omega t)$ is the digital-to-analog conversion output signal of the DAC 10. The digital-to-analog conversion output signal passes through a low-pass filter 11, and the low-pass filter 11 filters out the high-frequency noise of the digital-to-analog conversion output signal. A carrier wave generator 30 generates a carrier wave signal $f(\omega' t)$ 31 having a frequency slightly lower that of $f(\omega t)$. The two signals of f(ωt) and f(ω't) are sent to a comparator 20 for comparison, and the comparator 20 outputs a pulse signal s(t) to a register 40, and the register 40 outputs a low-speed pulse signal w(t). The low-speed pulse signal w(t) reflects the nonlinearity error of the output of the DAC 10. Therefore, the present invention needn't measure a high-speed analog signal with a high-speed or high-resolution measurement circuit but can measure the low-speed pulse signal w(t) with a logic analyzer (not shown in the drawings).

As $W_i$ corresponds to the difference of two sampling points, the offset error of the comparator 20 is neutralized naturally. The method of the present invention works in a low-speed sampling mode, and only a sampling point is taken in each cycle. Thus, the circuit operates in a very low working frequency. Therefore, the required circuit is easy to realize. Further, the final test eigenvalues are the pulse widths of digital signals, which are less likely to distort when transmitted to the outside of the chip. Besides, the oscilloscope of the existing ATE has superior time-domain sampling capability to achieve high precision in measuring the pulse width of signals. Considering the influence of noise on the pulse width during modulation, the duration of the test is prolonged to repeat the same sampling activities in the same positions and obtain an average of the pulse widths. Thus is reduced the influence of noise.

Figure 5:
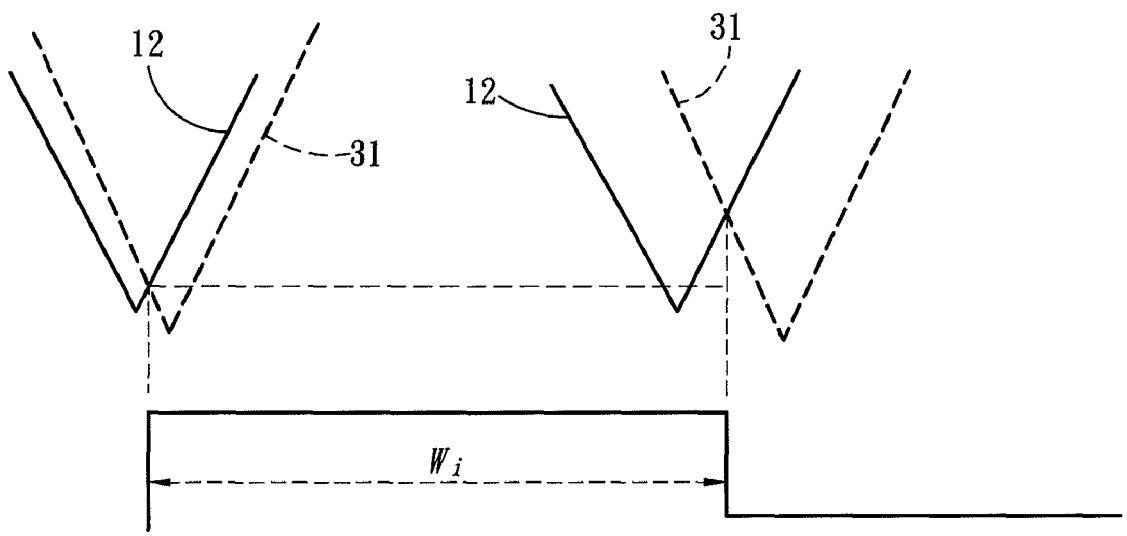
FIG. 5 is a diagram schematically a test eigenvalue according to the present invention.

Refer to FIGS. 4A-4C and FIG. 5. In the present invention, a triangular wave or a sinusoidal wave may be used as the low-frequency carrier wave signal 31. In the case of a triangular wave, the relationship of the period $T_c$ of the low-frequency carrier signal 31 and the period $T_{da}$ of the tested signal 12 (i.e. the digital-to-analog conversion output signal) is $T_c = T_{da} + \Delta T$, wherein $\Delta T$ is the difference of the period $T_c$ of the low-frequency carrier signal 31 and the period $T_{da}$ of the tested signal 12. The relationship between the slopes of the low-frequency carrier signal 31 and tested signal 12 is expressed by $$m_{da\_i} = \frac{z}{x} \text{ and } m_c = \frac{z}{y} = \frac{V_C - (-V_C)}{\frac{T_C}{2}} = \frac{V_c}{\frac{T_C}{4}}$$

wherein $T_{da} = 2 \times (2^n - 1) \times \frac{1}{f_{da}}$, and $T_c = 2 \times (2^n - 1) \times \frac{1}{f_{da}} + \Delta T$ As $\therefore \frac{y}{x} = \frac{m_{da}}{m_c}, \quad x = \Delta T - y = \Delta T - x \cdot \frac{m_{da}}{m_c}.$ Thus, $x = \frac{\Delta T}{1 + \frac{m_{da}}{m_c}}$ Then, the pulse width $W_i$ can be expressed by $$W_i = T_{da} + x = T_{da} + \frac{\Delta T}{1 + \frac{m_{da\_i}}{m_c}},$$

as shown in FIG. 5.

Suppose the tested circuit (the DAC 10) is an n-bit element having $(2^n - 1)$ quantization partitions and has N pieces of test eigenvalues W, respectively sampled from (N+1) signal cycles. In advance should be determined the cycle difference $\Delta T$ of the tested signal 12 and the carrier wave signal 31 and the relationship of the bit number n of the tested circuit and the period $T_{da}$ of the tested signal 12 before determining the frequency of the carrier wave signal 31 used in modulation.

Suppose that N sampling points is needed. Thus, (N+0.5) cycles are needed in obtaining the eigenvalues $W_i$, wherein i=1, 2, 3, ..., N.

Figure 6:
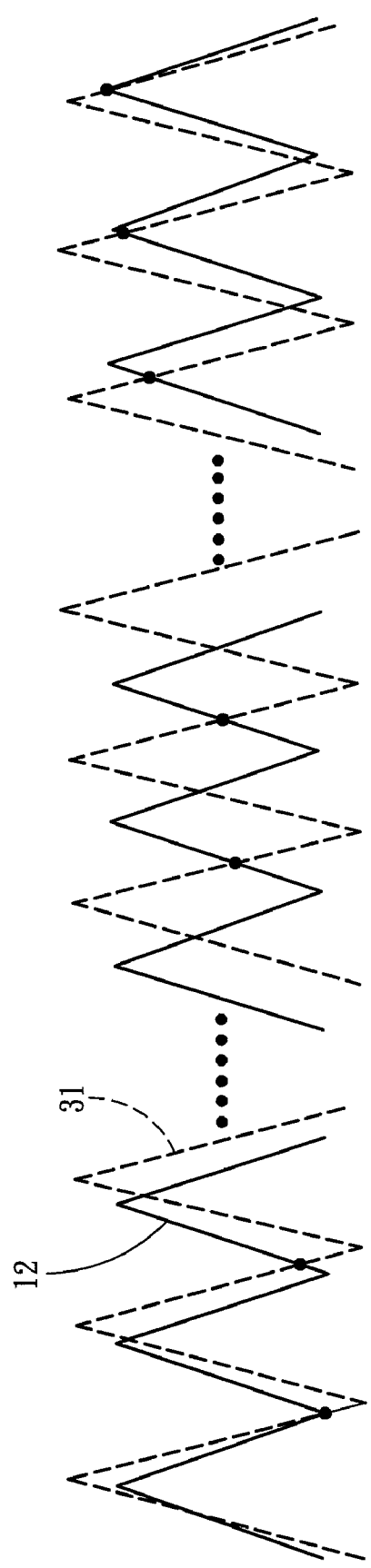
FIG. 6 is a diagram schematically showing the difference of the periods of a tested signal and a low-frequency carrier wave signal according to the present invention.

Thus, the working frequency of the low-frequency carrier wave signal 31 should be obtained. Refer to FIG. 6. In this case, the total sampling time is denoted by $\Sigma T$, and $\Sigma T$ has to meet the following equations:

$$\Sigma T = T_{da}(N + 0.5) > \sum_{i=1}^{N} W_i = NW$$

Therefore, $\therefore NT_{da} + \frac{T_{da}}{2} > N\left(T_{da} + \frac{\Delta T}{1 + \frac{m_{da}}{m_c}}\right)$ Thus, $W = \frac{\sum_{i=1}^{N} W_i}{N} \approx T_{da} + \frac{\Delta T}{1 + \frac{m_{da}}{m_c}},$ and $m_{da} = m_{da\_i}(\text{ideal}) = \frac{z}{x} = \frac{v_{da} - (-v_{da})}{\frac{T_{da}}{2}} = \frac{V_{da}}{\frac{T_{da}}{4}}$ From the abovementioned equations, it is known that the working frequency of the low-frequency carrier wave signal 31 can be expressed by $$f_c = \frac{1}{T_{da} + \Delta T}, \quad \text{wherein } \Delta T < \frac{T_{da}}{2N}\left(1 + \frac{m_{da}}{m_c}\right). \quad (1)$$

Figure 7A:
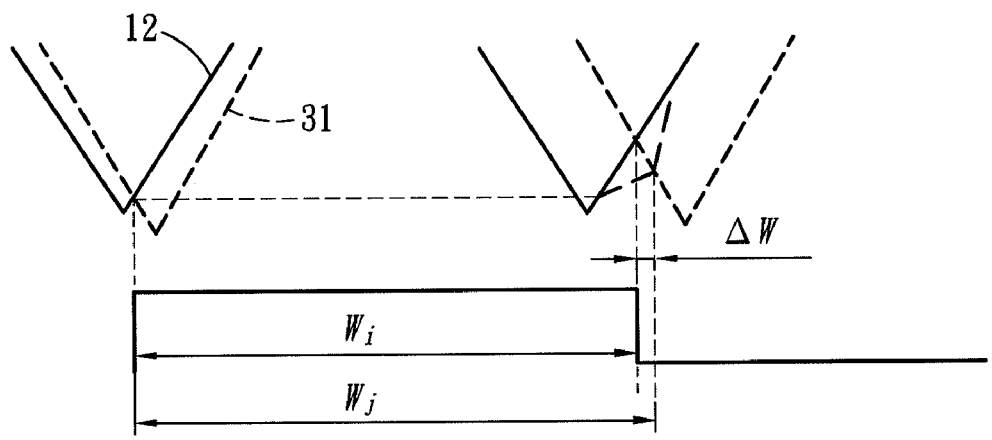
FIG. 7A is a diagram schematically showing the relationship of the nonlinearity error and the test eigenvalue according to the present invention.
Figure 7B:
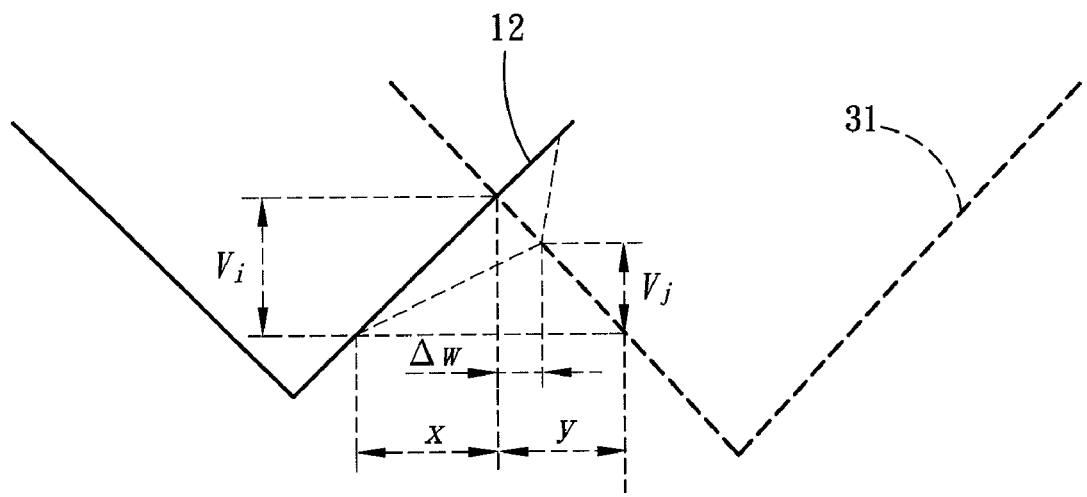
FIG. 7B is a partially enlarged view of FIG. 7A.

Refer to FIG. 7A and FIG. 7B for the relationship of the test eigenvalues and the nonlinearity error of the tested circuit. Suppose that the tested circuit has a nonlinearity error in a specified quantization partition and that the nonlinearity error results in a slope variation Δw in a segment of the tested signal, as shown in FIG. 7A. FIG. 7B is a partially enlarged view of FIG. 7A. The error-induced slope variation has the following relationships:

$$m_j = \frac{V_j}{x + \Delta w}, \quad m_i = \frac{V_i}{x}, \quad \text{and} \quad \frac{V_j}{V_i} = \frac{y - \Delta w}{y} = \frac{\Delta T - (x + \Delta w)}{y}. \quad (2)$$

Thus, $\therefore \frac{m_j}{m_i} = \frac{V_j}{V_i} \frac{x}{x + \Delta w} = \frac{\Delta T - (x + \Delta w)}{x + \Delta w} \frac{m_c}{m_{da}} = \frac{\Delta T - x'}{x'} \frac{m_c}{m_{da}},$ wherein $x' = x + \Delta w.$ Therefore, $m_{da} = \frac{\Delta T - (W_j - T_{da})}{W_j - T_{da}} m_c$ From the abovementioned equation, it is known that $W_j$ represents the pulse width modulation signal. Thereby, the nonlinearity error can be deduced from the pulse width, which is the result of the comparison of the low-frequency carrier wave signal 31 and the tested signal 12.

Figure 8:
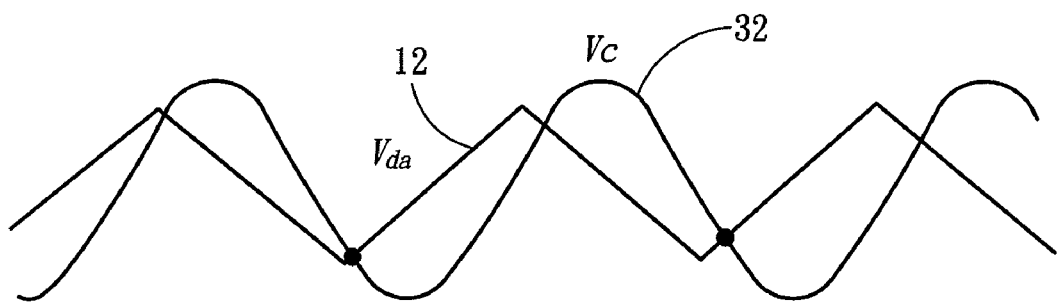
FIG. 8 is a diagram schematically showing a sinusoidal wave used as a low-frequency carrier wave signal according to the present invention.

Refer to FIG. 8, wherein a sinusoidal wave is used as a low-frequency carrier wave signal 32. In the practical test environment, a precision and adjustable triangular wave generator is harder to realize. A sinusoidal signal can be generated much more easily than a triangular wave. However, the modulation does not resorted to an instinctive linear manner when a sinusoidal wave is used as the low-frequency carrier wave signal 32. Thus, it is necessary to find out the relationship between the tested signal 12 and the modulated test eigenvalues.

Firstly, the low-frequency carrier wave signal 32 can be imagined to be a combination of piecewise linear slopes because the sampling points amount to a considerable number. In other words, the signal difference between two adjacent sampling points is very small. The voltage signals of two adjacent sampling points are supposed to have a linear relationship. However, the sampling points in different intervals have different linear relationships. Besides, the peak or trough of a sinusoidal signal is unsuitable to be the low-frequency carrier wave signal 32 because the slope variation thereof is too great. Therefore, the sinusoidal signal $V_c$ should be slightly greater than the tested signal $V_{da}$ lest the sampling points in the overlap regions of the two signals appear in the nearby of the peak or trough.

Therefore, the equation is rearranged into $$x = \frac{\Delta T}{1 + \frac{m_{da}}{m_c[i]}}$$

wherein $i = 1, 2, \ldots, N$, and $m_c[i] = \frac{d}{dt}[V_c \sin(\omega t)]$.

Figure 9:
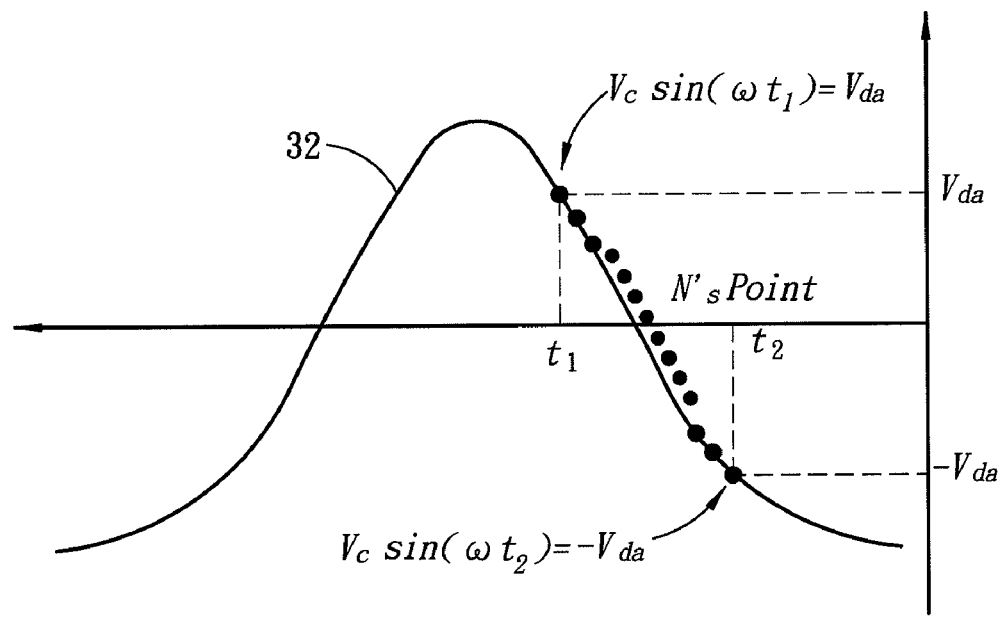
FIG. 9 is a diagram schematically showing the relationship of the amplitudes of a tested signal and a low-frequency carrier wave signal according to the present invention.

Refer to FIG. 9. The abovementioned $m_c[i]$ can be further expressed by $$m_c[i] = \frac{d}{dt}[V_c \sin(\omega t)] = \frac{V_c}{\omega} \cos(\omega t)\Big|_{t=t_2 - \frac{i}{N+1}(t_2 - t_1)}$$

wherein $i = 1, 2, 3, \ldots, N$, $t_1 = \frac{1}{\omega} \cdot \sin^{-1}\left(\frac{V_{da}}{V_c}\right)$, and $$t_2 = \frac{1}{\omega} \cdot \sin^{-1}\left(\frac{-V_{da}}{V_c}\right).$$

Figure 10:
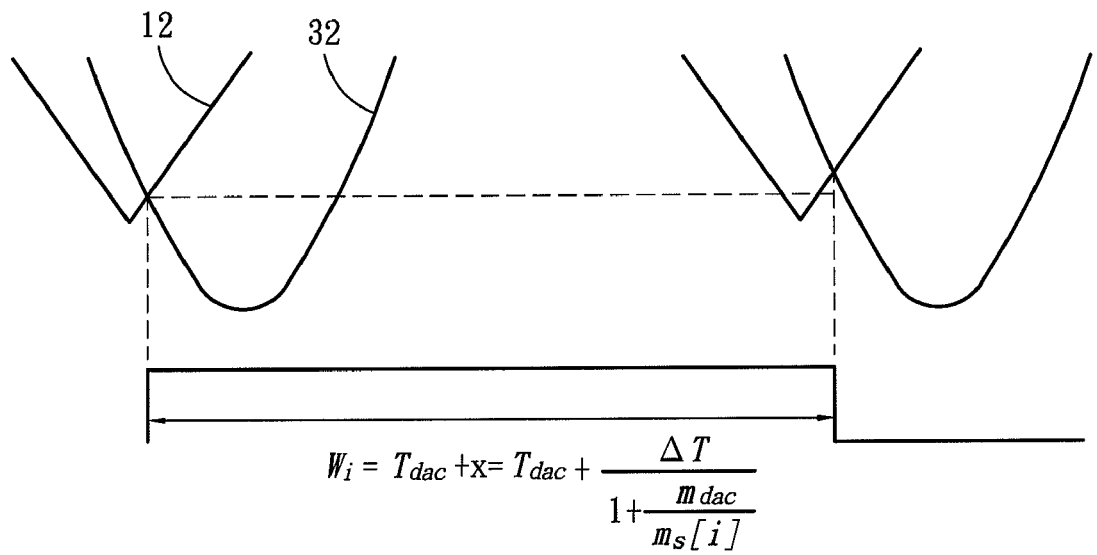
FIG. 10 is a diagram schematically showing the test eigenvalue according to the present invention.
Figure 11:
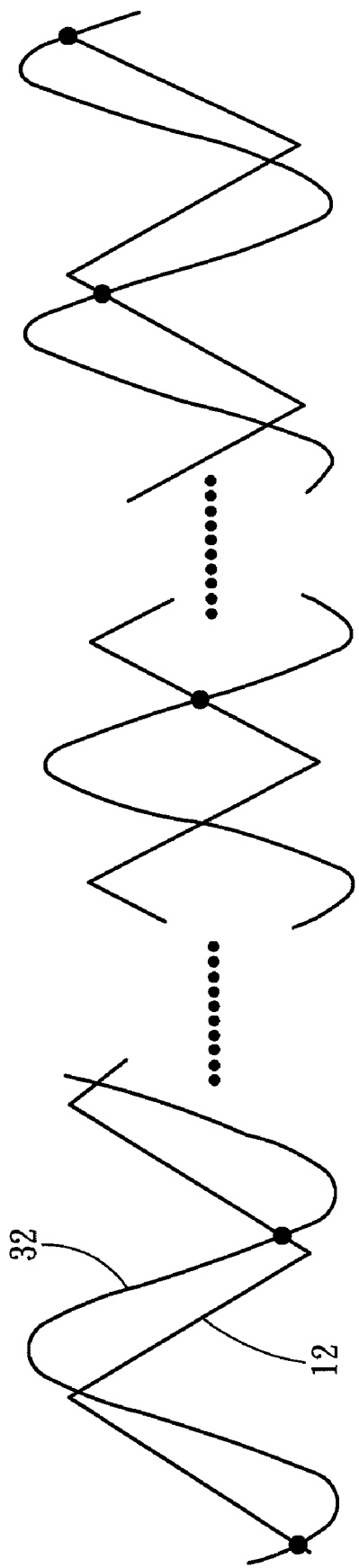
FIG. 11 is a diagram schematically showing the difference of the periods of a tested signal and a low-frequency sinusoidal carrier wave signal according to the present invention.

Refer to FIG. 10 and FIG. 11. Then, express the test eigenvalue $W_i$ in a similar form, and deduce the period difference $\Delta T$ of the tested signal 12 and the low-frequency carrier wave signal 32 to determine the frequency of the carrier wave signal used in modulation.

As the sampling points amount to a considerable number, i.e. the difference between two adjacent sampling points is very small, the voltage signals of two adjacent sampling points are supposed to have a linear relationship. However, the sampling points in different intervals have different linear relationships. Thus, Equation (1) is slightly modified as follows:

$$\because \sum T = NT_{da} + \frac{T_{da}}{2} > \sum_{i=1}^{N} W_i, \therefore$$

$$NT_{da} + \frac{T_{da}}{2} > \sum_{i=1}^{N}\left[T_{da} + \frac{\Delta T}{1 + \frac{m_{da}}{m_c[i]}}\right].$$

Figure 12A:
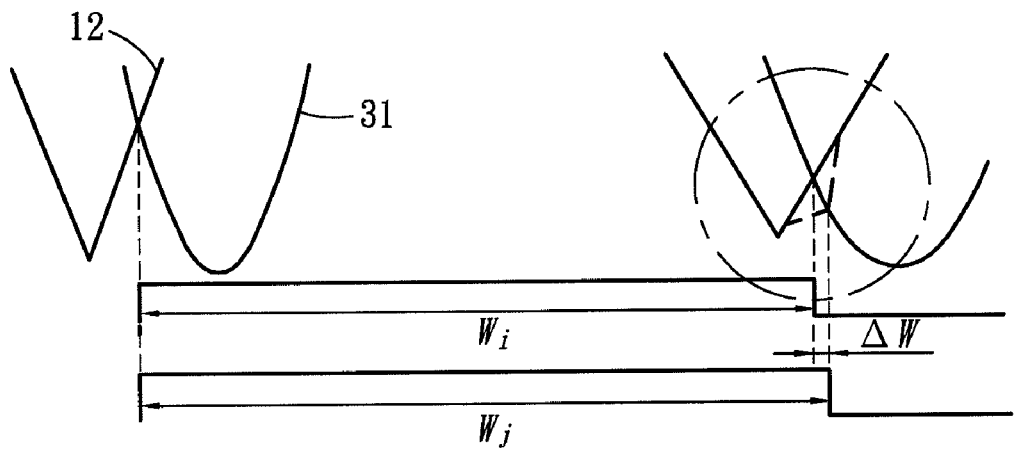
FIG. 12A is a diagram schematically showing the relationship of the nonlinearity error of a tested circuit and a test eigenvalue according to the present invention.
Figure 12B:
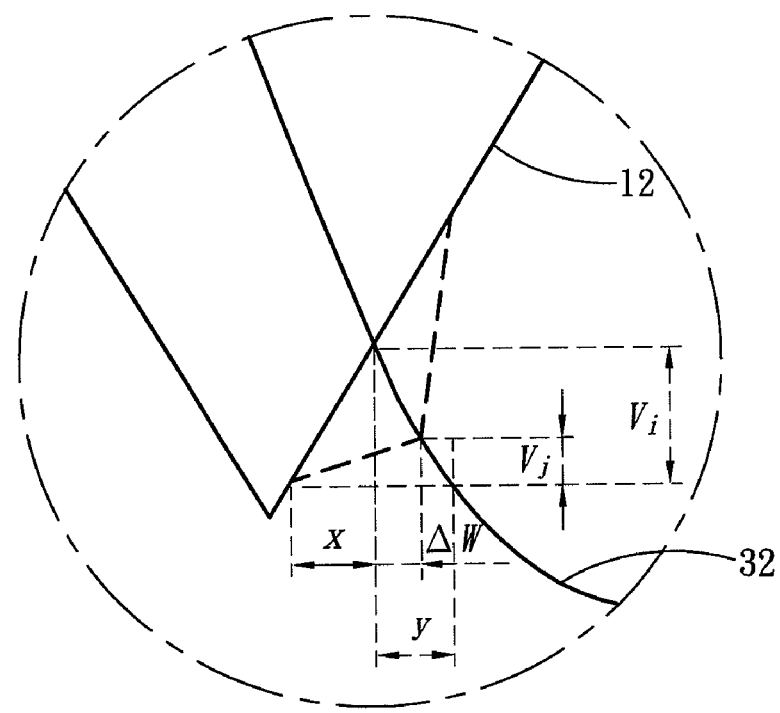
FIG. 12B is a partially enlarged view of FIG. 12A.

Thus, $\Delta T < \dfrac{T_{da}}{2 \times \sum_{i=1}^{N} \dfrac{1}{\left(1 + \dfrac{m_{da}}{m_c[i]}\right)}}.$ Refer to FIG. 12A and FIG. 12B. Similarly, Equation (2) is also slightly modified. Suppose that a nonlinearity error exists in a quantization partition of the tested circuit and causes a slope variation $\Delta w$ in a small segment. The slope variation $\Delta w$ is modified as follows:

$$m_j = \frac{v_j}{x + \Delta w}, \quad m_i = \frac{v_i}{x}, \text{ and } \frac{v_j}{v_i} = \frac{y - \Delta w}{y} = \frac{\Delta T - (x + \Delta w)}{y} \quad (2)$$

Then, $$\Rightarrow \frac{m_j}{m_i} = \frac{v_j}{v_i} \cdot \frac{x}{x + \Delta w} = \frac{\Delta T - (x + \Delta w)}{y} \cdot \frac{x}{x + \Delta w}$$

$$= \frac{\Delta T - (x + \Delta w)}{x + \Delta w} \cdot \frac{m_c[j]}{m_{da}} = \frac{\Delta T - x'}{x'} \cdot \frac{m_c[i]}{m_{da}}, \text{ wherein}$$

$x' = x + \Delta w$.

Thus, $m_{da} = \dfrac{\Delta T - (W_j - T_{da})}{W_j - T_{da}} \cdot m_c[i]$.

The present invention works out the relationship of the pulse width modulation and the nonlinearity error of the signal output by the DAC 10. In order to decrease the assessment error, the sampling points are increased instinctively. Such a measure can be easily realized via increasing the working frequency of the low-frequency carrier wave signal 32. Suppose that there is an 8-bit DAC having 255 quantization levels, and that 1020 points are sampled therefrom. Thus, each quantization level is sampled four times averagely, and the original 255 quantization levels will be worked out from the 1020 sampling points.

Figure 13A:
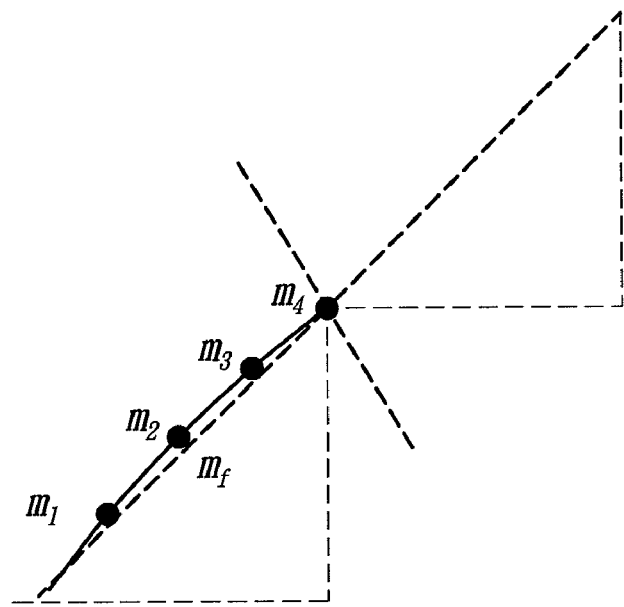
FIG. 13A is a diagram schematically showing four sampling points in ideal quantization levels according to the present invention.
Figure 13B:
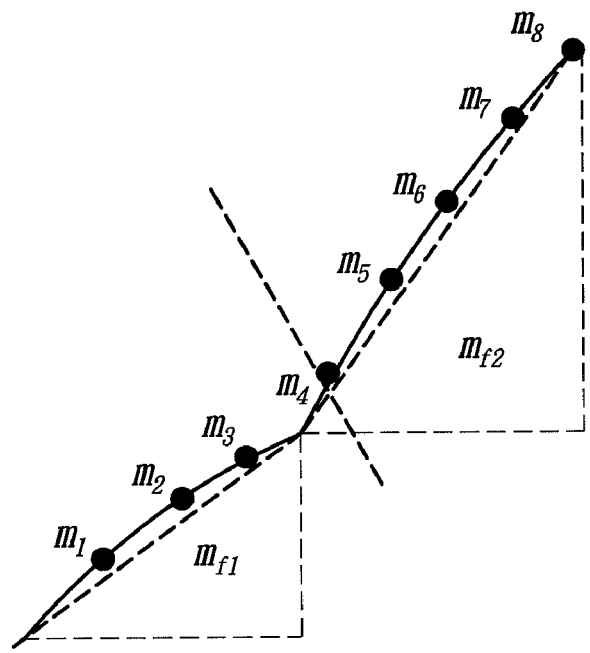
FIG. 13B is a diagram schematically showing four sampling points in physical quantization levels according to the present invention.

Refer to FIG. 3, FIG. 13A and FIG. 13B. Suppose that the DAC 10 is an ideal converter, and that each quantization level has the same number of sampling points. In such a case, the slope $m_f$ can be obtained from the slope average $m_i$ of each two adjacent points, wherein $i=1, \ldots, 4$. Unfortunately, the quantization levels of the DAC 10 are non-ideal in fact, and the sampling points are not all identical, as shown in FIG. 13B. It can be found in FIG. 13B that there is a slope inflection $m_4$ between the third and fourth sampling points. Therefore, in the calculation of $m_{f1}$ and $m_{f2}$, $m_4$ should be taken into the average. Thus, the differential nonlinearity error (DNL) can be worked out from the following equations:

$$m_{f1} = \frac{m_1 + m_2 + m_3 + m_4}{4}, \text{ and } m_{f2} = \frac{m_4 + m_5 + m_6 + m_7 + m_8}{5},$$

when $m_5 > m_3 > m_4$.

However, another case should be also taken in consideration. When $m_5 > m_4 > m_3$, it means that the third sampling point is very close to the inflection point. In other words, slope $m_3$ is much smaller than slope $m_4$. Thus, the average of $m_3$ and $m_4$ is almost equal to $m_4$. Therefore, $m_4$ should not be taken into the calculation of $m_{f1}$. Then, the equations should be modified as follows:

$$m_{f1} = \frac{m_1 + m_2 + m_3}{3}, \text{ and } m_{f2} = \frac{m_4 + m_5 + m_6 + m_7 + m_8}{5},$$

when $m_5 > m_4 > m_3$.

Figure 14:
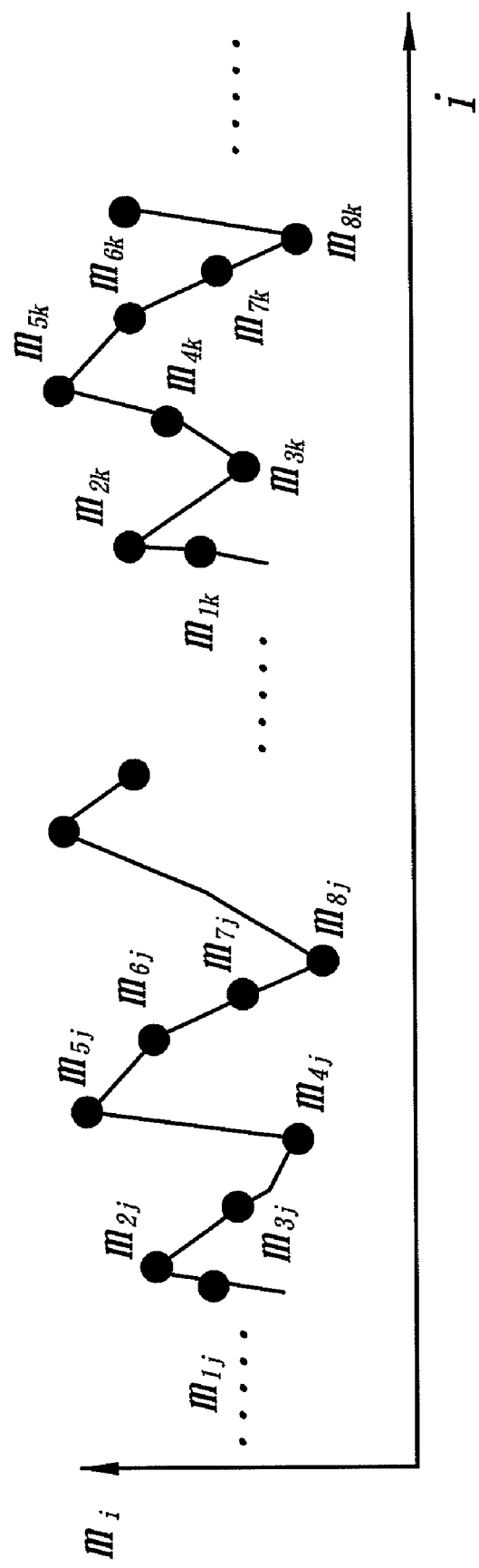
FIG. 14 is a diagram schematically showing the distribution of the slopes of the adjacent sampling points according to the present invention.

To demonstrate the DNL assessment, suppose that there are N sampling points. Refer to FIG. 14 for the distribution of the slope between every two adjacent sampling points. Firstly, the position where the slope has the maximum value is found out to function as the beginning of each code. Then, calculate the slope average corresponding to the maximum value of the slopes.

When $m_{5j} > m_{3j} > m_{4j}$, it is known from the preceding discussion that $$m_{f1j} = \frac{m_{1j} + m_{2j} + m_{3j} + m_{4j}}{4} \text{ and } m_{f5j} = \frac{m_{4j} + m_{5j} + m_{6j} + m_{7j} + m_{8j}}{5}.$$

When $m_{5k} > m_{4k} > m_{3k}$, $m_{f1k} = \frac{m_{1k} + m_{2k} + m_{3k}}{3}$ and $$m_{f5k} = \frac{m_{4k} + m_{5k} + m_{6k} + m_{7k} + m_{8k}}{5}.$$

For an n-bit DAC and N sampling points, the DLN assessment will be normalized as follows:

Find out the maximum slope from $m_{max}[k] = \{m_{mk}\}$, k=1, 2, ..., $2^n - 1$.

In the first situation, when $(m_{k+1} > m_{k+1}^{-2} > m_{mk+1}^{-1})$, $$DNL[k] = \frac{\sum_{j=m_k-1}^{m_{k+1}-1} m_j}{m_{k+1} - m_k + 1}.$$

In another situation, when $(m_{k+1} > m_{mk+1}^{-1} > m_{mk+1}^{-2})$ $$DNL[k] = \frac{\sum_{j=m_k-1}^{m_{k+1}-2} m_j}{m_{k+1} - m_k}.$$

The integral nonlinearity error (INL) can be obtained via summing DNL and expressed by $$INL_{estimation}[i] = \sum_{k=1}^{i} DNL[k].$$

Via the preceding equation, INL can be easily worked out from DNL. However, INL also incorporates the systematic errors of DNL.

In order to solve the problem, the source of the systematic errors should be found out, whereby the systematic errors can be separated from the real INL. The pulse width modulation itself has systematic errors because a sinusoidal carrier wave is regarded as the combination of piecewise linear slopes in assessing DNL. In fact, a sinusoidal carrier wave is not a combination of piecewise linear slopes but a combination of continuous curves. Thus, minor errors systematically exist between the real DNL and the assessed DNL. The systematic error appears and varies periodically with the frequency of the output of DAC. Thus, INL can be assessed via the following equations:

$$INL_{estimation}[i] = \sum_{k=1}^{i} DNL_{estimation} = \sum_{k=1}^{i} [DNL_{real}[k] + \varepsilon(\omega k)],$$

wherein $\varepsilon(\omega k)$ represents the systematic error of INL, and $$\omega = \frac{2\pi}{T_{da}}.$$

From the viewpoint of signal, the INL signal can be regarded as the integral of DNLs, including the systematic errors of DNLs. The period of the signal output by DAC is very great. Because the frequency of the systematic error is much smaller than that of the DNL signal, the systematic error can be removed via a mere high-pass filter (HPF) to improve the accuracy of INL assessment. Thus, the equation for INL is slightly modified into $$INL[i] = HPF\left\{\sum_{k=1}^{i} [DNL_{real}[k] + \varepsilon(\omega k)]\right\} = \sum_{k=1}^{i} DNL_{real}[k].$$

In conclusion, the present invention proposes a testing method to assess the non-ideal effect of a high-speed DAC. The method of the present invention applies the down-conversion sampling technology to realize a PWM (Pulse Width Modulation) signal, whereby the nonlinearity error of the tested circuit is converted into the variation of pulse width. Thus, the method of the present invention does not need a high-speed or high-definition device to capture analog signals.

What is claimed is:

1. A method for testing a nonlinearity error of a high-speed digital-to-analog converter, comprising:
    obtaining a digital-to-analog conversion output signal of a high-speed digital-to-analog converter;
    providing a low-frequency carrier wave signal;
    providing a comparator, and inputting the digital-to-analog conversion output signal and the low-frequency carrier wave signal into the comparator to obtain a low-speed pulse signal;
    using a logic analyzer to assess variation of the low-speed pulse signal; and
    working out a nonlinearity error of the high-speed digital-to-analog converter from the variation of the low-speed pulse signal.

2. The method for testing a nonlinearity error of a high-speed digital-to-analog converter according to claim 1, wherein the low-frequency carrier wave signal is a triangular wave.

3. The method for testing a nonlinearity error of a high-speed digital-to-analog converter according to claim 2, wherein the frequency of the low-frequency carrier wave signal is slightly lower that that of the digital-to-analog conversion output signal.

4. The method for testing a nonlinearity error of a high-speed digital-to-analog converter according to claim 2, wherein the frequency of the low-frequency carrier wave signal is slightly higher that that of the digital-to-analog conversion output signal.

5. The method for testing a nonlinearity error of a high-speed digital-to-analog converter according to claim 1, wherein the low-frequency carrier wave signal is a sinusoidal wave.

6. The method for testing a nonlinearity error of a high-speed digital-to-analog converter according to claim 5, wherein the frequency of the low-frequency carrier wave signal is adjusted to vary the number of sampling points in the overlap of the low-frequency carrier wave signal and the digital-to-analog conversion output signal and modify the assessment accuracy, and wherein the amplitude of the low-frequency carrier wave signal is controlled to prevent the digital-to-analog conversion output signal from appearing in the nearby of the peak or trough of the low-frequency carrier wave signal.

\* \* \* \* \*